(12) United States Patent
Sato

(10) Patent No.: US 6,393,041 B1
(45) Date of Patent: May 21, 2002

(54) APPARATUS AND METHOD FOR CONTROLLING SEMICONDUCTOR LASER MODULE

(75) Inventor: Kazuyoshi Sato, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/558,172

(22) Filed: Apr. 26, 2000

(30) Foreign Application Priority Data

May 10, 1999 (JP) .......................................... 11-128276

(51) Int. Cl.[7] .......................................... H01S 5/0683
(52) U.S. Cl. .................................................. 372/29.021
(58) Field of Search ........................... 372/29.021, 29.02

(56) References Cited

U.S. PATENT DOCUMENTS 5,287,367 A * 2/1994 Yanagawa ..................... 372/31
5,978,393 A * 11/1999 Feldman et al. .............. 372/31
6,101,200 A * 8/2000 Burbidge et al. ............. 372/29

* cited by examiner

Primary Examiner—James W. Davie
(74) Attorney, Agent, or Firm—McGinn & Gibb, PLLC

(57) ABSTRACT

Disclosed is an apparatus for controlling a semiconductor laser module wherein despite an increase in laser driving current owing to aging of the laser module, temperature control can be performed accurately so as to render constant the actual temperature of the laser module and prevent a change in lasing wavelength that accompanies a change in temperature. The apparatus includes a photodiode for sensing optical intensity of the laser; an APC circuit for controlling driving current of the laser in accordance with an output from the photodiode; a thermistor for sensing the temperature of the laser module; an ATC circuit for driving an electronic laser-cooling device in accordance with an output from the thermistor; and a current-quantity sensing circuit, which is connected to the APC and ATC circuits, for sensing the driving current of the laser output from the APC circuit. Data obtained by measurement of actual temperature of the laser module in relation to the laser driving current is stored in the ATC circuit in advance. The data obtained by measurement, laser driving current information output from the current-quantity sensing circuit and temperature information output from the thermistor are compared and the driving current of the cooling device is set, based upon the result of the comparison, in such a manner that the actual temperature of the laser module is rendered constant.

16 Claims, 3 Drawing Sheets

APPARATUS AND METHOD FOR CONTROLLING SEMICONDUCTOR LASER MODULE

FIELD OF THE INVENTION

The present invention relates to an apparatus and method for controlling a semiconductor laser module.

BACKGROUND OF THE INVENTION

The explosive popularization of the Internet has been accompanied by a remarkable increase in transmission capacity needed for backbone systems. The importance of high-density wavelength multiplexing optical-fiber transmission in terms of raising transmission capacity is growing and semiconductor lasers used in such optical-fiber transmission require both stable optical power and wavelength.

Conventionally, semiconductor lasers used in such fields as optical communications and optical measurement emit light in two directions. The light in one direction is sensed by a photodiode and the driving current of the semiconductor laser is controlled so as to render constant the amount of current through the photodiode, thereby stabilizing the light emitted in the other direction. This makes it possible to exercise control to increase the driving current of the semiconductor laser and hold the strength of the output light constant even if the semiconductor laser deteriorates with time.

Owing to the passage of driving current through the semiconductor laser, the temperature thereof rises and the refractive index of the semiconductor laser element increases, thereby causing the lasing wavelength to shift toward the long-wavelength side. A method often employed to solve this problem includes disposing a thermistor on the carrier of the semiconductor laser to sense temperature and cooling the semiconductor laser by an electronic cooling device using a Peltier element.

An apparatus of this kind for controlling a semiconductor laser module will be described with reference to FIG. 3.

FIG. 3 is a block diagram illustrating an example of the prior art in which an automatic power control (APC) circuit 4 and an automatic temperature control (ATC) circuit 5 are connected to a semiconductor laser module.

The APC circuit 4, which is for rendering constant the optical output power of a semiconductor laser 1, will be described first.

The semiconductor laser 1 emits laser beams from both ends in directions extending to the right and left in FIG. 3. Backward-emitted light 8 on the right side is used to exercise control in such a manner that the output power of forward-emitted light 7 on the left side is rendered constant. The backward-emitted light 8 is received by a photodiode 2 and photoelectrically converted to a monitor current 10, which is then input to the APC circuit 4. The latter controls a laser driving current 9, which is output to the semiconductor laser 1, so as to render the value of the monitor current 10 constant, thereby rendering constant the forward-emitted light 7. In other words, the laser driving current 9 is controlled in such a manner that the intensity of the laser light is rendered constant regardless of the wavelength of the laser emission.

The ATC circuit 5 for controlling the temperature of the semiconductor laser 1 will be described next.

A thermistor 6 is placed on the carrier in close proximity to the semiconductor laser 1 in order to sense the temperature of the semiconductor laser 1. The ATC circuit 5 senses the resistance value of the thermistor 6 and passes a driving current 12 into an electronic cooling device 3 in such a manner that the resistance value attains a reference resistance value, thereby holding the temperature of the semiconductor laser 1 constant.

More specifically, the ATC circuit 5 passes the driving current 12 through the cooling device 3 in a direction that cools the thermistor 6 if the temperature sensed by the thermistor 6 is higher than a set temperature, and passes a current in a direction that heats the thermistor 6 if the temperature sensed thereby is lower than the set temperature. The ATC circuit 5 controls temperature in such a manner that the value of the passed current increases if the difference between the sensed temperature of the thermistor 6 and the set temperature is large and decreases if the temperature difference is small. Thus, the ATC circuit 5 exercises control in such a manner that the temperature of semiconductor laser 1 remains constant independently of the optical output power of the semiconductor laser 1, i.e., independently of the magnitude of the laser driving current 9.

Accordingly, the APC circuit 4 controls the laser driving current 9 in such a manner that the monitor current 10 of the photodiode 2 remains constant even if a change in the temperature of the semiconductor laser 1 is accompanied by a change in the wavelength characteristic of the output light. The APC circuit 4 thus operates so as to hold the intensity of the output light constant. On the other hand, the ATC circuit 5 causes the cooling device 3 to operate independently of the APC circuit 4 to hold the temperature of the semiconductor laser 1 constant, regardless of the magnitude of the laser driving current 9, if the temperature of the semiconductor laser unit varies.

SUMMARY OF THE DISCLOSURE

However, the following problems have been encountered in the course of investigation toward the present invention. Namely, the conventional control apparatus of this construction for controlling a semiconductor laser module has a certain drawback relating to a shift in wavelength. Specifically, when the semiconductor laser 1 begins to age, the lasing threshold-value current increases and there is a corresponding increase in the laser driving current 9 for obtaining the desired optical output power, the actual rise in the temperature of the semiconductor laser 1 and the reading (value) of the temperature rise of thermistor 6 are no longer the same owing to the existence of a thermal resistance between the semiconductor laser 1 and a carrier part on which the thermistor 6 is placed. Even if the temperature of the thermistor 6 is held constant, therefore, the semiconductor laser 1 assumes a temperature higher by an amount commensurate with the value of the thermal resistance. As a result of this higher temperature, the lasing wavelength of the semiconductor laser 1 is shifted toward the side of longer wavelengths owing to a change in index of refraction.

This problem associated with the rise in the temperature of the semiconductor laser 1 that accompanies the change in the laser driving current 9 is particularly significant in high-density wavelength-multiplexing optical communication. The reason is that the change in wavelength accompanying the temperature rise of the semiconductor laser 1 causes crosstalk and a decline in reception sensitivity, thereby degrading the transmission characteristics.

Accordingly, an object of the present invention is to provide an apparatus and method for controlling a semiconductor laser module wherein even if laser driving current increases owing to aging of the semiconductor laser, temperature control can be performed accurately so as to render constant the actual temperature of the semiconductor laser and prevent a change in lasing wavelength that accompanies a change in temperature.

According to a first aspect of the present invention, the foregoing object is attained by providing an apparatus for controlling a (e.g., semiconductor) laser module, comprising: a laser (particularly semiconductor laser), an optical sensor for sensing optical intensity of the laser; optical-power stabilizer for controlling driving current of the semiconductor laser in accordance with an output from the optical sensor; a temperature sensor disposed in the proximity of the laser for sensing the temperature thereof; temperature controller for driving an electronic cooling device, which cools the semiconductor laser, in accordance with an output from the temperature sensor; and a module of predicting actual temperature of the laser from information indicative of the driving current of the laser and temperature information output from the temperature sensor.

According to a second aspect of the present invention, the foregoing object is attained by providing an apparatus for controlling a (e.g., semiconductor) laser module, comprising: a laser (particularly semiconductor laser), an optical sensor for sensing optical intensity of the laser; optical-power stabilizer for controlling driving current of the semiconductor laser in accordance with an output from the optical sensor; a temperature sensor placed in the proximity of the laser for sensing the temperature thereof; temperature controller for driving an electronic cooling device, which cools the laser, in accordance with an output from the temperature sensor; and a current-quantity sensor, which is connected to the optical-power stabilizer and temperature controller, for sensing the driving current of the laser output from the optical-power stabilizer; wherein data obtained by actual measurement of actual temperature of the laser in relation to the driving current of the laser is stored in the temperature controller in advance, and the driving current of the cooling device is set upon comparing the data obtained by actual measurement, laser driving current information output from the current-quantity sensor, and temperature information output from the temperature sensor.

According to a third aspect of the present invention, the foregoing object is attained by providing a method of controlling a (e.g., semiconductor) laser module wherein driving current of a laser (particularly semiconductor laser), is controlled by optical-power stabilizer on the basis of an output from an optical sensor which senses optical intensity of the laser, and an electronic cooling device for cooling the laser is driven by temperature controller on the basis of on output of a temperature sensor placed in the proximity of the laser. The method comprises: previously storing, in the temperature controller, data obtained by actual measurement of actual temperature of the laser in relation to the driving current of the laser when the electronic cooling device is driven; comparing the data obtained by actual measurement, laser driving current information output from the optical-power stabilizer and temperature information output from the temperature sensor; and driving the electronic cooling device of the basis of the comparison in such a manner that the actual temperature of the laser is rendered constant.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS

A preferred mode for practicing the present invention will now be described.

Figure 1:
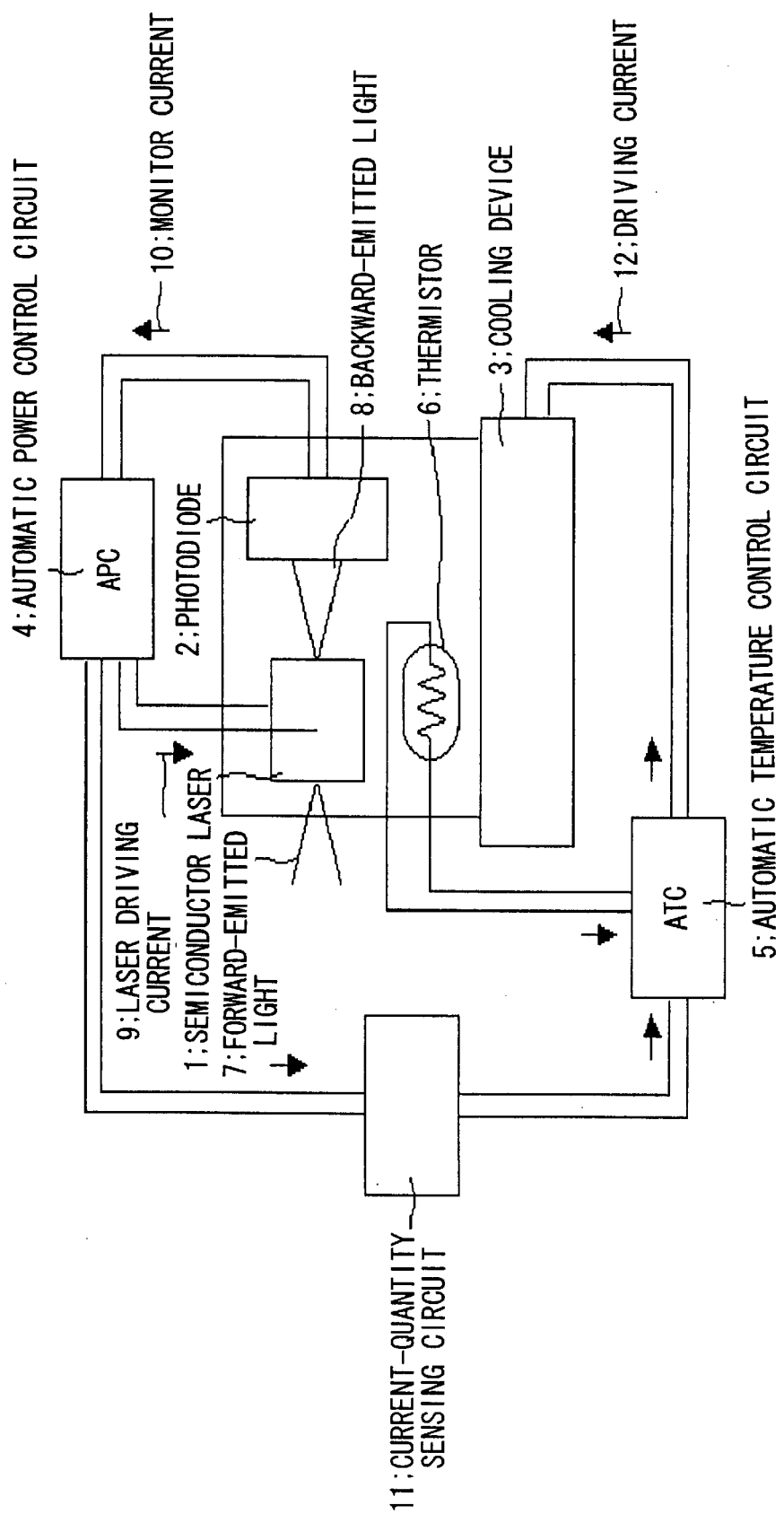
FIG. 1 is a block diagram schematically illustrating the construction of an apparatus for controlling a semiconductor laser according to a preferred embodiment of the present invention.

As shown in FIG. 1, an apparatus for controlling a semiconductor laser 1 according to a preferred mode for practicing the present invention includes a photodiode 2 for sensing optical intensity of the semiconductor laser 1; an optical-power stabilizing circuit 4 for controlling driving current of the semiconductor laser 1 in accordance with an output from the photodiode 2; a thermistor 6 placed in the proximity of the semiconductor laser 1 for sensing the temperature thereof; a temperature control circuit 5 for driving an electronic cooling device, which cools the semiconductor laser 1, in accordance with an output from the thermistor 6; and a current-quantity sensing circuit 11, which is connected to the optical-power stabilizing circuit 4 and temperature control circuit 5, for sensing the driving current of the semiconductor laser 1 output from the optical-power stabilizing circuit 4. Data obtained by actual measurement of actual temperature of the semiconductor laser 1 in relation to the driving current of the semiconductor laser is stored in the temperature control circuit 5 in advance. The data obtained by actual measurement, laser driving current information output from the current-quantity sensing circuit 11 and temperature information output from the thermistor are compared (e.g., by data processing) and the driving current of the cooling device is set, based upon the result of the comparison, in such a manner that the actual temperature of the semiconductor laser is rendered constant.

Figure 2:
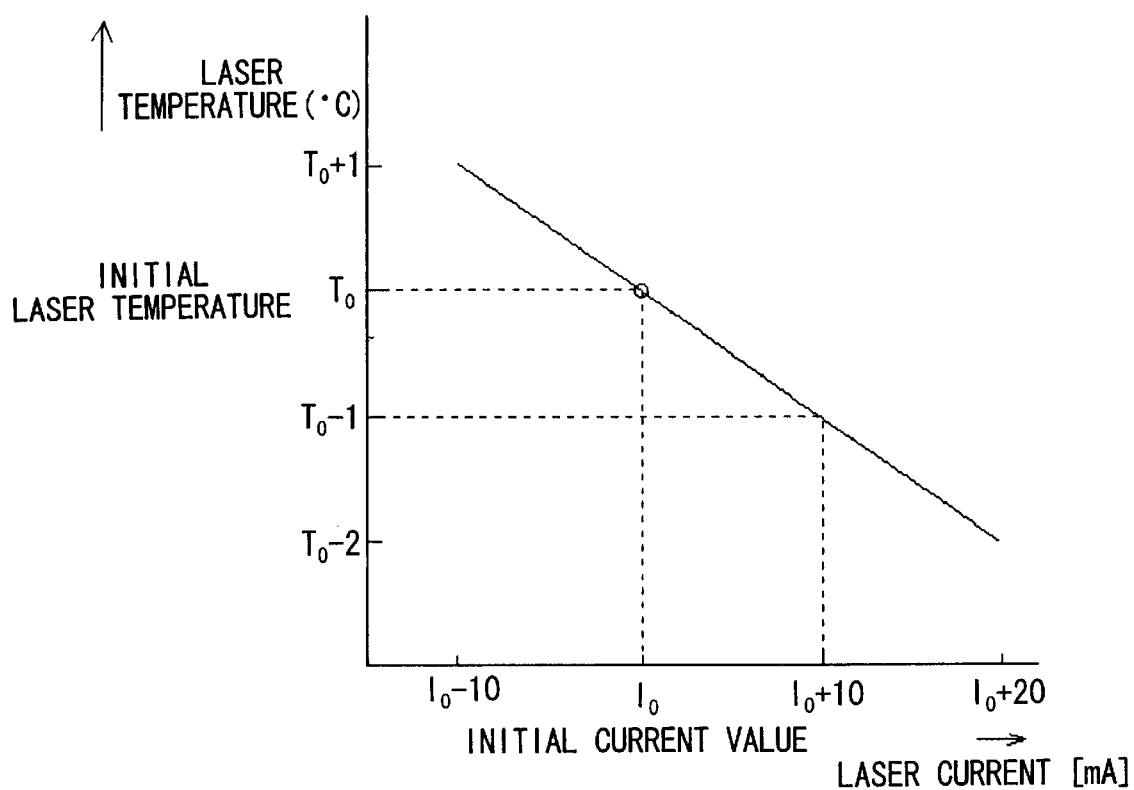
FIG. 2 is a characteristic diagram in which laser module temperature is plotted against the value of laser driving current when lasing wavelength is held constant.
Figure 3:
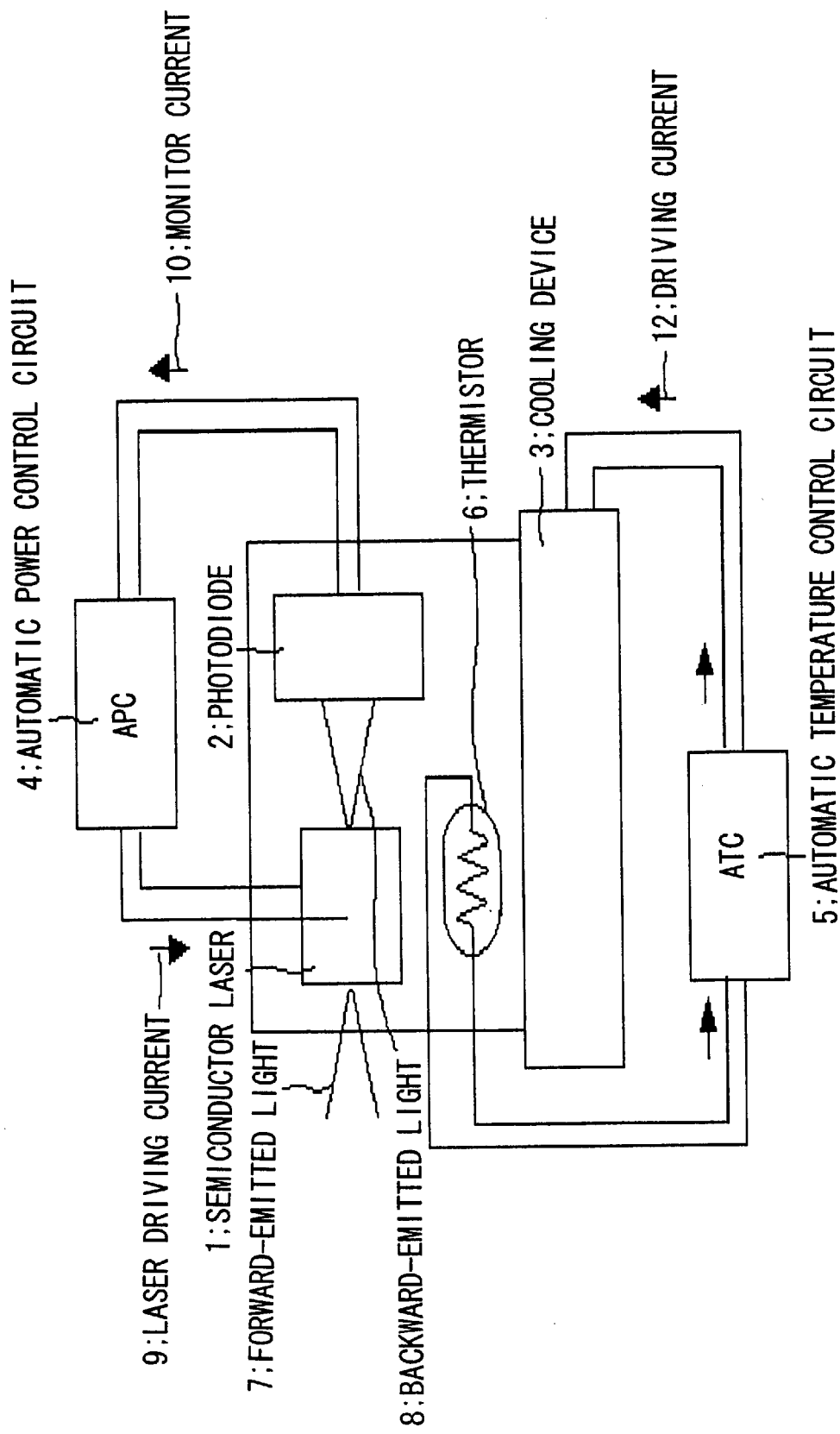
FIG. 3 is a block diagram showing the construction of an apparatus for controlling a semiconductor laser in accordance with the prior art.

A preferred embodiment of the present invention will now be described in greater detail with reference to FIGS. 1 and 2, in which FIG. 1 is a block diagram useful in describing the construction of an apparatus for controlling a semiconductor laser module according to a preferred embodiment of the present invention, and FIG. 2 is a diagram showing the relationship between laser temperature and laser current.

The construction of the apparatus for controlling the air semiconductor laser module according to this embodiment will be described first.

As shown in FIG. 1, the apparatus includes a photodiode 2 for sensing backward-emitted light from a semiconductor laser 1; an APC (automatic power control) circuit 4 which, on the basis of a monitor current 10 from the photodiode 2, stabilizes the optical output power of the semiconductor laser 1 at a desired optical output power level; a thermistor 6 for sensing the temperature of the semiconductor laser 1; a cooling device 3 for cooling the semiconductor laser 1; and an ATC (automatic temperature control) circuit 5 for controlling a driving current 12 of a cooling device 3. According to a characterizing feature of this embodiment, the current-quantity sensing circuit 11 is connected to the APC circuit 4 and ATC circuit 5.

Further, according to the characterizing feature of this embodiment, data obtained by actual measurement of the temperature of the laser in response to the driving current of the laser is stored beforehand in the current-quantity sensing circuit 11, which senses the value of the laser driving current 9, and this data is used to control the ATC circuit 5 to stabilize the lasing wavelength of the semiconductor laser 1.

The APC circuit 4, which is for rendering constant the optical output power of the semiconductor laser 1, will be described first.

The semiconductor laser 1 emits laser beams from both ends in directions extending to the right and left in FIG. 1. The backward-emitted light 8 on the right side is used by the ATC a circuit 4 to exercise control in such a manner that the output power of forward-emitted light 7 on the left side is rendered constant. The backward-emitted light 8 is received by the photodiode 2 and photoelectrically converted to a monitor current 10, which is then input to the APC circuit 4. The latter controls the laser driving current 9, which is output to the semiconductor laser 1, so as to render the value of the monitor current 10 constant, thereby rendering constant the forward-emitted light 7.

Wavelength stabilizing module (the current-quantity sensing circuit 11 and ATC circuit 5) for controlling the wavelength of the semiconductor laser 1, which constitutes a feature of this embodiment, will be described next.

In the conventional apparatus for controlling a semiconductor laser module, the APC circuit 4 and ATC circuit 5 exercise control independently of each other and temperature is controlled, irrespective of the value of the laser driving current 9, in such a manner that the temperature of the thermistor 6 is rendered constant. Consequently, even when the semiconductor laser 1 ages, the lasing threshold-value current increases and there is an increase in the driving current 9, the ATC circuit 5 operates in accordance solely with a reading (value) of the temperature rise of thermistor 6.

However, there is thermal resistance between the semiconductor laser 1 and thermistor 6, and thus, the actual value of the rise in the temperature of the semiconductor laser 1 does not correspond perfectly to the reading (value) of the temperature rise at the thermistor 6. As a consequence, the actual temperature of the semiconductor laser 1 cannot be held constant with the conventional method and, hence, the lasing wavelength fluctuates owing to a change in the refractive index of the semiconductor laser 1.

By contrast, in accordance with this embodiment, information indicative of the driving current 9 applied to the semiconductor laser 1 from the APC circuit 4 is output to the current-quantity sensing circuit 11. This information concerning the driving current 9 is transmitted to the ATC circuit 5. The latter predicts the amount of rise in the temperature of the semiconductor laser 1 by referring to the actual-measurement data, which indicates laser temperature versus driving current, stored previously in this circuit. By comparing this predicted value with information representing the ambient temperature of the semiconductor laser 1 sent from the thermistor 6, the ATC circuit controls the driving current 12 sent to the cooling device 3 in such a manner that the actual temperature of the semiconductor laser 1 is rendered constant.

The relationship between the driving current 9 of semiconductor laser 1 and temperature thereof stored in the ATC circuit 5 will be described with reference to FIG. 2.

FIG. 2 is a characteristic diagram in which laser module temperature is plotted against the value of laser driving current when lasing wavelength of the semiconductor laser 1 is held constant. The characteristic shown in FIG. 2 is measured in advance and then stored in the ATC circuit 5. Before the driving current 9 of the laser changes, the resistance value of the thermistor 6 is detected and a current is passed into the cooling device 3 in such a manner that the sensed resistance value becomes equal to a reference resistance value, as a result of which the temperature of the semiconductor laser 1 is held constant.

If the laser driving current 9 varies from an initial current value $I_0$, the amount of change in the driving current 9 is sensed by the current-quantity sensing circuit 11 connected to the APC circuit 4 and this information is transmitted to the ATC circuit 5. On the basis of the characteristic (FIG. 2) measured previously, the ATC circuit 5 drives the cooling device 3 so as to vary the temperature setting of the semiconductor laser 1 from the initial laser temperature $T_0$ in response to a change in the driving current 9. In the case of the characteristic shown in FIG. 2, the ATC circuit 5 drives the cooling device 3 so as to cool the laser temperature by 1° C. if the laser driving current 9 rises by 10 mA from the initial value.

Thus, according to the apparatus for controlling the semiconductor laser according to this embodiment, the laser driving current 9 from the APC circuit 4, which holds the optical output power of the semiconductor laser 1 constant, is sensed by the current-quantity sensing circuit 11 and information indicative thereof is transmitted to the ATC circuit 5. The latter compares information computed based upon the previously stored relationship between laser driving current and laser temperature with the temperature information from the thermistor 6 and drives the cooling device 3 in such a manner that the actual temperature of the semiconductor laser 1 is rendered constant. Accordingly, even if thermal resistance (i.e., difference in temperatures) develops between the semiconductor laser 1 and the thermistor 6, the actual temperature of the semiconductor laser 1 can be controlled in an accurate fashion. This makes it possible to prevent a change in laser wavelength associated with a rise in the temperature of the semiconductor laser 1.

Though this embodiment has been described in regard to a case where a semiconductor laser is used as the light-emitting element, the present invention is not limited to this embodiment. Optical power and lasing wavelength can be stabilized simultaneously in the same manner even in the case of a laser module, e.g., an integrated semiconductor laser device obtained by integrating a light-emitting element and a modulator. Further, though the data representing the relationship between the driving current and temperature of the laser is stored in the ATC circuit 5 beforehand in the foregoing embodiment, it goes without saying that this data can be stored in the current-quantity sensing circuit 11 and a comparison can be made between the information concerning the APC circuit 4 and the information concerning the ATC circuit 5.

Thus, in accordance with the apparatus for controlling a laser module, (particularly, semiconductor laser module) according to the present invention as described above, it is possible to stabilize both the optical output power level and lasing wavelength of a semiconductor laser. This can be achieved because of the operative association between the optical-power stabilizing circuit, which stabilizes the output power of the laser at a desired output power level, and the temperature control circuit that controls the temperature of the semiconductor laser. The actually measured data indicative of the relationship between the driving current and temperature of the semiconductor laser is stored beforehand and the actual temperature of the semiconductor laser can be control led based upon this data, information indicative of the driving current of the laser and information indicative of the ambient temperature of the laser.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An apparatus for controlling a semiconductor laser module, comprising:
   a semiconductor laser;
   an optical sensor for sensing optical intensity of the semiconductor laser;
   optical-power stabilizing means for controlling driving current of the semiconductor laser in accordance with an output from said optical sensor;
   a temperature sensor disposed in the proximity of the semiconductor laser for sensing the temperature thereof;
   temperature control means for driving an electronic cooling device, which cools the semiconductor laser, in accordance with an output from said temperature sensor; and
   means for predicting actual temperature of the semiconductor laser from information indicative of the driving current of the semiconductor laser and temperature information output from said temperature sensor.

2. An apparatus for controlling a semiconductor laser module, comprising:
   a semiconductor laser;
   an optical sensor for sensing optical intensity of the semiconductor laser;
   optical-power stabilizing means for controlling driving current of the semiconductor laser in accordance with an output from said optical sensor;
   a temperature sensor disposed in the proximity of the semiconductor laser for sensing the temperature thereof;
   temperature control means for driving an electronic cooling device, which cools the semiconductor laser, in accordance with an output from said temperature sensor; and
   current-quantity sensing means, which is connected to said optical-power stabilizing means and to said temperature control means, for sensing the driving current of the semiconductor laser output from said optical-power stabilizing means;
   wherein data obtained by actual measurement of actual temperature of the semiconductor laser in relation to the driving current thereof is stored in said temperature control me means in advance, and the driving current of said cooling device is set upon comparing the data obtained by actual measurement, laser driving current information output from said current-quantity sensing means, and temperature information output from said temperature sensor.

3. A method of controlling a semiconductor laser module wherein driving current of a semiconductor laser is controlled by an optical-power stabilizer on the basis of an output from an optical sensor which senses optical intensity of the semiconductor laser, and an electronic cooling device for cooling the semiconductor laser is driven by temperature controller on the basis of on output of a temperature sensor placed in the proximity of the semiconductor laser,
   said method comprising: predicting actual temperature of the semiconductor laser from laser driving current output from said optical-power stabilizer and temperature information output from said temperature sensor.

4. A method of controlling a semiconductor laser module wherein driving current of a semiconductor laser is controlled by an optical-power stabilizer on the basis of an output from an optical sensor which senses optical intensity of the semiconductor laser, and an electronic cooling device for cooling the semiconductor laser is driven by a temperature controller on the basis of on output of a temperature sensor disposed in the proximity of the semiconductor laser, said method comprising:
   previously storing, in said temperature controller, data obtained by actual measurement of actual temperature of the semiconductor laser in relation to the driving current thereof when said electronic cooling device is driven;
   comparing the data obtained by actual measurement, laser driving current output from said optical-power stabilizer and temperature information output from said temperature sensor; and
   driving said electronic cooling device based on said comparison in such a manner that the actual temperature of the semiconductor laser is rendered constant.

5. A laser apparatus comprising a laser controlling module, comprising:
   a laser unit;
   an optical sensor for sensing optical intensity of the laser unit;
   optical-power stabilizer controlling driving current of the laser unit in accordance with an output from said optical sensor;
   a temperature sensor disposed in the proximity of the laser unit for sensing the temperature thereof;
   temperature controller for driving an electronic cooling device, which cools the laser, in accordance with an output from said temperature sensor; and
   a circuit predicting actual temperature of the laser unit from information indicative of the driving current of the laser unit and temperature information output from said temperature sensor.

6. A laser apparatus of claim 5, wherein said laser unit comprises a semiconductor laser.

7. A laser apparatus comprising a laser controlling module, comprising:
   a laser unit;
   an optical sensor for sensing optical intensity of the laser unit;
   optical-power stabilizing circuit controlling driving current of the laser unit in accordance with an output from said optical sensor;
   a temperature sensor disposed in the proximity of the laser unit for sensing the temperature thereof;
   temperature control circuit for driving an electronic cooling device, which cools the laser unit, in accordance with an output from said temperature sensor; and
   current-quantity sensing circuit, which is connected to said optical-power stabilizing circuit and to said temperature control circuit, for sensing the driving current of the laser output from said optical-power stabilizing circuit;

wherein data obtained by actual measurement of actual temperature of the laser unit in relation to the driving current thereof is stored in said temperature control means in advance, and the driving current of said cooling device is set upon comparing the data obtained by actual measurement, laser driving current information output from said current-quantity sensing circuit, and temperature information output from said temperature sensor.

8. A laser apparatus of claim 7, wherein said laser unit comprises an integrated semiconductor laser.

9. A method of controlling a laser module wherein driving current of a laser is control led by an optical-power stabilizer means on the basis of an output from an optical sensor which senses optical intensity of the laser, and an electronic cooling device for cooling the laser is driven by temperature controller on the basis of on output of a temperature sensor placed in the proximity of the laser, said method comprising: predicting actual temperature of the laser from laser driving current output from said optical-power stabilizer and temperature information output from said temperature sensor.

10. A method of claim 9, wherein said predicting actual temperature of the laser is performed by comparing said laser driving current output and said temperature information output, both preliminarily stored in a store device.

11. A method of claim 10, wherein said store device comprises a temperature control circuit for controlling said cooling device.

12. A method of claim 10, wherein said temperature further controls circuit temperature of said temperature sensor.

13. A method of claim 10, wherein said store device comprises said temperature control circuit for controlling said cooling device.

14. A method of claim 10, wherein said store device comprises a current sensor for said laser driving current.

15. A method of claim 9, wherein said laser comprises a semiconductor laser.

16. A method of controlling a laser module wherein driving current of a laser is control led by an optical-power stabilizer on the basis of an output from an optical sensor which senses optical intensity of the semiconductor laser, and an electronic cooling device for cooling the semiconductor laser is driven by a temperature controller on the basis of on output of a temperature sensor disposed in the proximity of the semiconductor laser, said method comprising:

previously storing, in said temperature controller, data obtained by actual measurement of actual temperature of the semiconductor laser in relation to the driving current thereof when said electronic cooling device is driven;

comparing the data obtained by actual measurement, laser driving current output from said optical-power stabilizer and temperature information output from said temperature sensor; and driving said electronic cooling device based on said comparison in such a manner that the actual temperature of the semiconductor laser is rendered constant.

* * * * *